(12) United States Patent
Barsky

(10) Patent No.: US 8,031,452 B2
(45) Date of Patent: Oct. 4, 2011

(54) SINGLE-SUPPLY SINGLE-ENDED HIGH VOLTAGE PEAK DETECTOR

(75) Inventor: Lev Michael Barsky, New York, NY (US)

(73) Assignee: Siemens Industry, Inc., Alpharetta, GA (US)

( * ) Notice: Subject to any disclaimer, the term of this patent is extended or adjusted under 35 U.S.C. 154(b) by 146 days.

(21) Appl. No.: 12/499,676

(22) Filed: Jul. 8, 2009

(65) Prior Publication Data

US 2010/0008007 A1   Jan. 14, 2010

Related U.S. Application Data

(60) Provisional application No. 61/079,643, filed on Jul. 10, 2008.

(51) Int. Cl.
    *H02H 3/22* (2006.01)
(52) U.S. Cl. ........................ 361/93.1; 361/111
(58) Field of Classification Search .............. 361/56, 361/91.1, 111, 58, 93.1
    See application file for complete search history.

(56) References Cited

U.S. PATENT DOCUMENTS

| | | | | |
|---|---|---|---|---|
| 3,979,642 A | * | 9/1976 | Cath et al. | 361/56 |
| 4,038,568 A | | 7/1977 | May et al. | 307/351 |
| 5,075,627 A | * | 12/1991 | Bodig et al. | 324/384 |
| 7,643,262 B2 | * | 1/2010 | Titschert et al. | 361/91.1 |
| 2004/0130326 A1 | * | 7/2004 | Yamamoto | 324/503 |
| 2007/0126480 A1 | | 6/2007 | Mcquirk et al. | 327/58 |

FOREIGN PATENT DOCUMENTS

| | | |
|---|---|---|
| EP | 1 322 018 | 6/2003 |
| GB | 2 016 844 | 9/1979 |
| JP | 10 332748 | 12/1998 |

OTHER PUBLICATIONS

International Search Report dated Oct. 30, 2009 for Application No. PCT/US2009/050187.
Written Opinion of the International Searching Authority dated Oct. 30, 2009 for Application No. PCT/US2009/050187.

\* cited by examiner

*Primary Examiner* — Danny Nguyen

(57) ABSTRACT

A device for current detection is disclosed and includes a protection circuit having a current input provided via a positive input and a negative input arranged in parallel to the positive input, a pair of diodes communicatively coupling the positive input to the negative input, wherein the pair of diodes are configured to protect an operational amplifier from an overvoltage and negative voltages, and a peak detector in communication with the protection stage, wherein the peak detector is configured to receive an output provided by the operation amplifier of the protection stage, and wherein the peak detector is configured to create a peak detector output representative of the current input.

12 Claims, 2 Drawing Sheets

SINGLE-SUPPLY SINGLE-ENDED HIGH VOLTAGE PEAK DETECTOR

PRIORITY CLAIM

This patent document claims the priority benefit provided under 35 U.S.C. §119(e) to U.S. provisional patent application Ser. No. 61/079,643, filed on Jul. 10, 2008. The content of this provisional patent application is incorporated herein by reference for all purposes.

BACKGROUND

Methods, systems, circuits and devices for high voltage signal detection and discrimination are typically complex. The increased complexity of known high voltage signal detection and discrimination methods, systems, circuits and devices increase costs and may be impractical, when a dual or split supply used in known methods is unavailable or inaccessible, or when utilizing a differential receiver is unfeasible.

SUMMARY

This patent and the disclosure provided herein relates to methods, systems, circuits and devices for detecting and discriminating between received incoming high voltage AC and DC signals or currents. In particular, the disclosed embodiment provides for a single device or circuit configured to detect and differentiate between a high voltage AC signal and a DC signal. In one embodiment, the high voltage AC signal such as the audio signal from a speaker is detected and received while the DC signal is prevented from DC loading of an amplifier. DC loading of the amplifier may be avoided by capacitive coupling, for example, capacitor (C3) and, if necessary, capacitor (C4) shown in FIG. 1.

In one embodiment, a device for current detection is disclosed. The device includes a protection circuit having a current input provided via a positive input and a negative input arranged in parallel to the positive input, a pair of diodes communicatively coupling the positive input to the negative input, wherein the pair of diodes are configured to protect an operational amplifier from an overvoltage and negative voltages, and a peak detector in communication with the protection stage, wherein the peak detector is configured to receive an output provided by the operation amplifier of the protection stage, and wherein the peak detector is configured to create a peak detector output representative of the current input.

In one embodiment, a device for current detection is disclosed. The device includes a protection circuit having a current input provided via a positive input and a negative input arranged in parallel to the positive input, a pair of diodes communicatively coupling the positive input to the negative input, wherein the pair of diodes are configured to protect an operational amplifier from an overvoltage and negative voltages, and a Schmitt trigger in communication with the protection stage, wherein the Schmitt trigger is configured to receive an output provided by the operation amplifier of the protection stage, and wherein the Schmitt trigger is configured to create an output representative of the current input.

In another embodiment, a device for current detection is disclosed. The device includes a protection circuit having a current input provided via a positive input and a negative input arranged in parallel to the positive input, a positive input capacitor arranged along the positive input, a negative input capacitor arranged along the negative input; and a pair of diodes communicatively coupling the positive input to the negative input, wherein a first diode is arranged in between the positive input and the negative input and the second diode is arranged along the positive input, and wherein the pair of diodes is configured to protect an operational amplifier from an overvoltage and negative voltages. The device further includes a comparator in communication with the protection stage, wherein the comparator trigger is configured to receive an output provided by the operation amplifier of the protection stage, and wherein the comparator trigger is configured to create a comparator output representative of the current input.

Other embodiments are disclosed, and each of the embodiments can be used alone or together in combination. Additional features and advantages of the disclosed embodiments are described in, and will be apparent from, the following Detailed Description and the figures.

DETAILED DESCRIPTION

This patent and the disclosure provided herein relates to methods, systems, circuits and devices for detecting the presence of a high voltage or level AC signal or current utilizing a single-supply, signal ended receiver. In one embodiment, the high voltage AC signal such as the audio signal from a speaker is detected and received while the DC signal is preventing from DC loading of an amplifier.

The disclosed methods, systems, circuits and devices utilize a single-supply, which are typically inexpensive to implement and transmit when compared to a dual-supply. For example, in a single-supply system or configuration, only one voltage source and return is needed, i.e., only 2 wires for power transmission. By way of comparison, in a split or dual supply configuration, two voltage sources: a positive and a negative, and a return (additional circuitry+3 wires for transmission) are necessary thereby increasing the overall cost and complexity of the configuration. Single-supplies are typically more common than dual or split supplies, and are therefore more readily available from the overlying system. In addition, the disclosed methods, systems, circuits and devices include or incorporate overvoltage protection, which allows a system designer to interface high-voltage signals, such as 100V audio, to a receiver powered with a (relatively) low-voltage single supply.

A single-ended receiver, as opposed to a differential receiver, further provides a cost-effective option when utilized with a single supply. For example, cost savings may be realized using a single-ended transmitter and a single signal wire. Moreover, the signal source may be located close to the receiver (e.g., a microphone disposed substantially adjacent to an amplifier) or if the signal quality is of lesser importance (e.g., if the system is utilized only to detect the presence of a signal), a designer can utilize a common reference for the transmitter and receiver (e.g., the power return would work well, as it already likely connects the two devices either directly or through the overlying system power supply), a single-ended transmitter (i.e. op-amp), and a single wire as the signal source. In fact, in a case like this, capacitor 108 (C4) may be unnecessary because the reference is ground.

Figure 1:
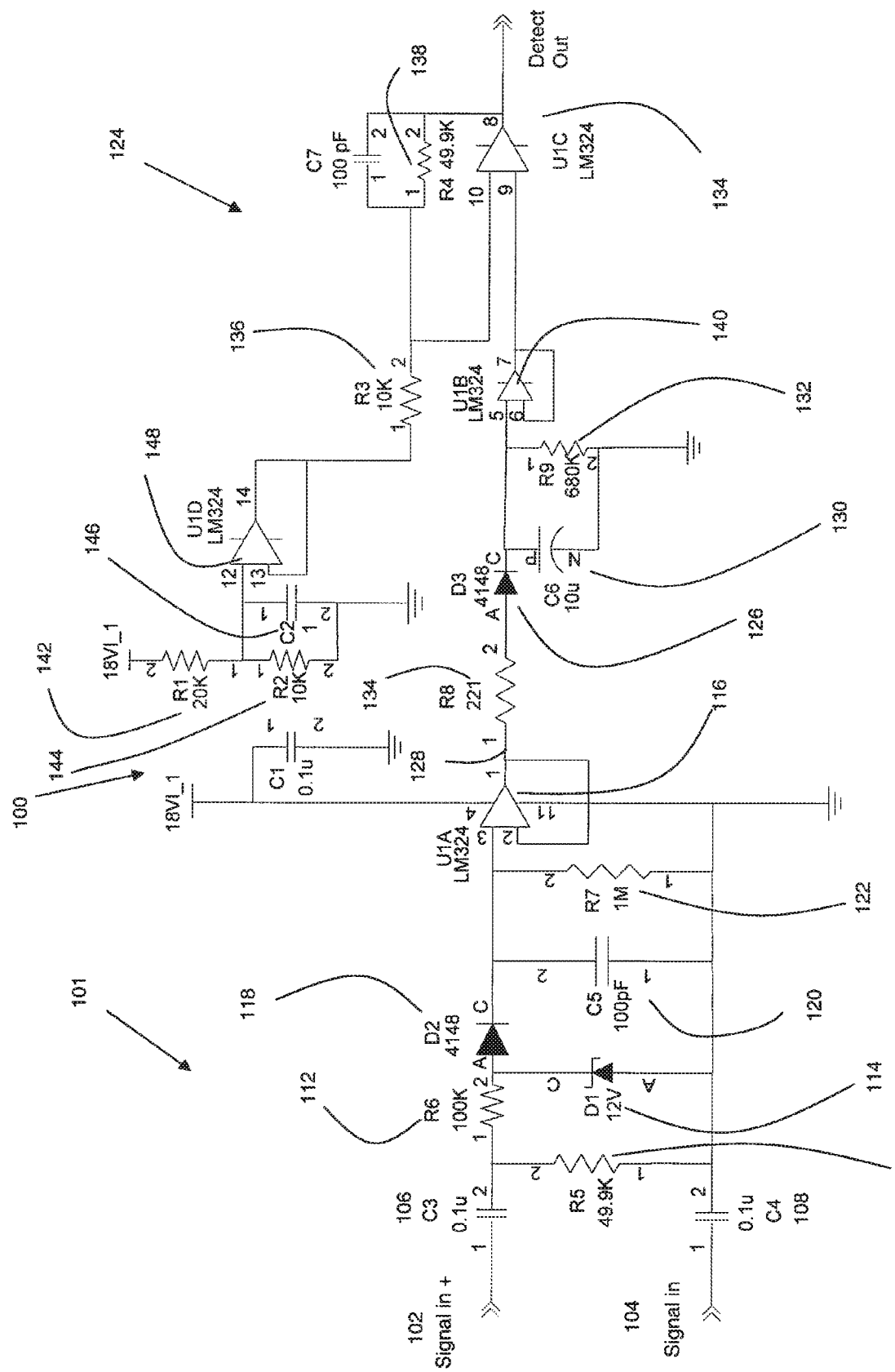
FIG. 1 illustrates an embodiment of a detection and discrimination circuit configured according to the disclosure provided herein.

FIG. 1 illustrates an exemplary detection module or circuit 100 configured to detect the presence of a high voltage or level AC signal or current utilizing a single-supply, signal-ended receiver while avoiding the simultaneous DC loading of the amplifier. In particular, the exemplary detection circuit 100 includes a protection interface, module or circuit 101 configured to detect an AC signal provided or communicated via the positive signal "Signal In +" input (identified by reference numeral 102) and the negative signal "Signal In −" input (identified by reference numeral 104) while simultaneously disregarding and/or ignoring any DC signal provided via the inputs 102, 104 thereby avoiding DC loading on the signal generator, such as an audio amplifier In one embodiment, the exemplary protection interface or circuit 101 includes a pair of capacitively coupled capacitors 106 (C3) and 108 (C4) arranged in cooperation with the resistors 110 (R5) and 112 (R6). The capacitor 106 (C3) is arranged along the input 102 and the capacitor 108 (C4) is arranged along the input 104. Resistor 110 (R5) is configured and arranged to provide a current return for the capacitors 106 (C3) and 108 (C4). In particular, the resistor 110 (R5) communicatively couples input 102 to input 104. Resistor 112 (R6) is configured and arranged along the input 102 to limit or otherwise control the input current received via inputs 102, 104. In another embodiment, the capacitor 106 (C3) and the capacitor 108 (C4) may be omitted if DC loading of the amplifier is not a design consideration or concern. In yet another embodiment, the capacitor 108 (C4) may be removed where a single wire for signaling with a common ground reference is utilized.

Diode 114 (D1) communicatively couples input 102 to input 104 and protects operational amplifier (op-amp) 116 (U1A) from overvoltage. Similarly, a diode 118 (D2) is arranged along the input 102 and is configured to protect the op-amp 116 (U1A) from negative voltage. Differential amplifier topology may be utilized in this situation instead of the circuitry up to and including the voltage follower or operational amplifier (op-amp) 116 (U1A). However, with one of the inputs tied to ground, it's still technically a single-ended receiver regardless of what implementation is used.

Capacitor 120 (C5) communicatively couples input 102 to input 104 and is configured to prevent negative voltage undershoots during the transition of an AC input signal received via the input 102 to input 104 from positive to negative voltage. Resistor 122 (R7) may be arranged in parallel to the capacitor 120 (C5) and the diode 114 (D1) and provides, controls and regulates a current flow from input 102 through diode 118 (D2) to the input 104 thereby preventing the diode 118 (D2) from picking up ambient noise, such as the U.S. 60 Hz power line noise. In other words, the constant minor current flow through diode 118 (D2) prevents it from picking up the ambient noise and other interference.

The exemplary detection circuit 100 further includes a peak detector 124 arranged in communication with the op-amp 116 (U1A). The op-amp 116 (voltage follower topology) may be utilized as a voltage buffer, providing a low-impedance output at the same voltage as the clipped signal from the preceding protection interface or circuit 101 or other passive circuit. If necessary, and if loading of the signal source is not an issue, the module or circuit 100 may be implemented without the voltage buffer, with the signal source charging the accumulating capacitor 130 (C6) directly through a single current limiting resistor (not shown) thereby replacing resistor 112 (R6) and resistor 134 (R8).

The resistor 134 (R8) limits the current provided by the op-amp 116 (U1A). The peak detector 124, in turn, utilizes diode 126 (D3) to charge a capacitor 130(C6) to the highest positive-voltage value of an input signal 128 received from the op-amp 116 (U1A), while preventing a voltage discharge along any path other than the bleeding resistor 132 (R9). The buffered or stored peak voltage along with the combination of values of capacitor 130 (C6) and resistor 132 (R9) arranged in parallel with each other determines the amount of time it takes capacitor 130 (C6) to discharge. This discharge time is also referred to as a cough delay. The current limiting resistor (resistor 134 (R8) or the series resistance of the passive circuit if the voltage buffer is omitted as described above) will determine the charge time of capacitor 130 (C6), and therefore will help determine the response time of the entire circuit (in combination with the op-amp properties, value of capacitor 130 (C6), and the output trigger properties). Alternatively, other means for controlling discharge time may include utilizing a physical (mechanical) or electronic switch to reset the peak detector 124 instead of, or in addition to, the discharge time or cough delay.

The peak detector 124 further includes a Schmitt trigger built around or upon an op-amp 135 (U1C) in cooperation with resistors 136 (R3) and 138 (R4). The Schmitt trigger is essentially a comparator circuit that positive feedback where the ratio of the resistors 136 (R3) and 138 (R4) determines the hysteresis. Capacitor 137 (C7) may be a "speed-up" capacitor used to accelerate the op-amp switching speed and avoid unwanted oscillations. The capacitor 137 (C7) can be omitted, but is recommended when using an op-amp-based Schmitt trigger. The hysteresis of a Schmitt triggers generally describes a pair of selectable or adjustable thresholds. When an input to the Schmitt trigger is above a first threshold, the Schmitt trigger provides a high output. When the input to the Schmitt trigger is below a second threshold, the Schmitt trigger maintains the value or magnitude of the input. In other words, when an input to a non-inverting Schmitt trigger is above the high threshold, the Schmitt trigger provides a high output. The output remains high until the input to the Schmitt trigger falls below the low threshold. The behavior of an inverting Schmitt trigger is the same with the exception of output levels, which are low for a high input, and high for a low input.

The Schmitt trigger incorporated into the peak detector 124 may be an active low trigger such that a negative output signal or supply indicates the presence of a positive input signal. A comparator or active-high circuit may be utilized or substituted based on the desired behavior and part selection.

A voltage buffer 140 (U1B) protects and prevents the op-amp 135 (U1C) from interacting with the capacitor 130 (C6). The voltage buffer 140 (U1B) eases and/or simplifies the overall circuit design by preventing or protecting against unwanted interactions with any circuitry that follows. The reference or output associated with the op-amp 135 (U1C) is provided or scaled by the ratio of resistors 142 (R1) and 144 (R2) derived from the supply voltage, while the capacitor 146 (C2) provides low-pass filtering. A voltage follower 148 (U1D) buffers or otherwise stores the reference or output associated with the op-amp 135 (U1C). This reference can be unbuffered (with care), unfiltered, or implemented in another way, e.g., off-the-shelf discrete voltage reference. The output provided by peak detector 124, "Detect Out", is high (near the positive supply rail) for an inactive signal or a signal below a first threshold, and low (near the negative supply rail) for an active signal or signal above a second threshold.

Figure 2:
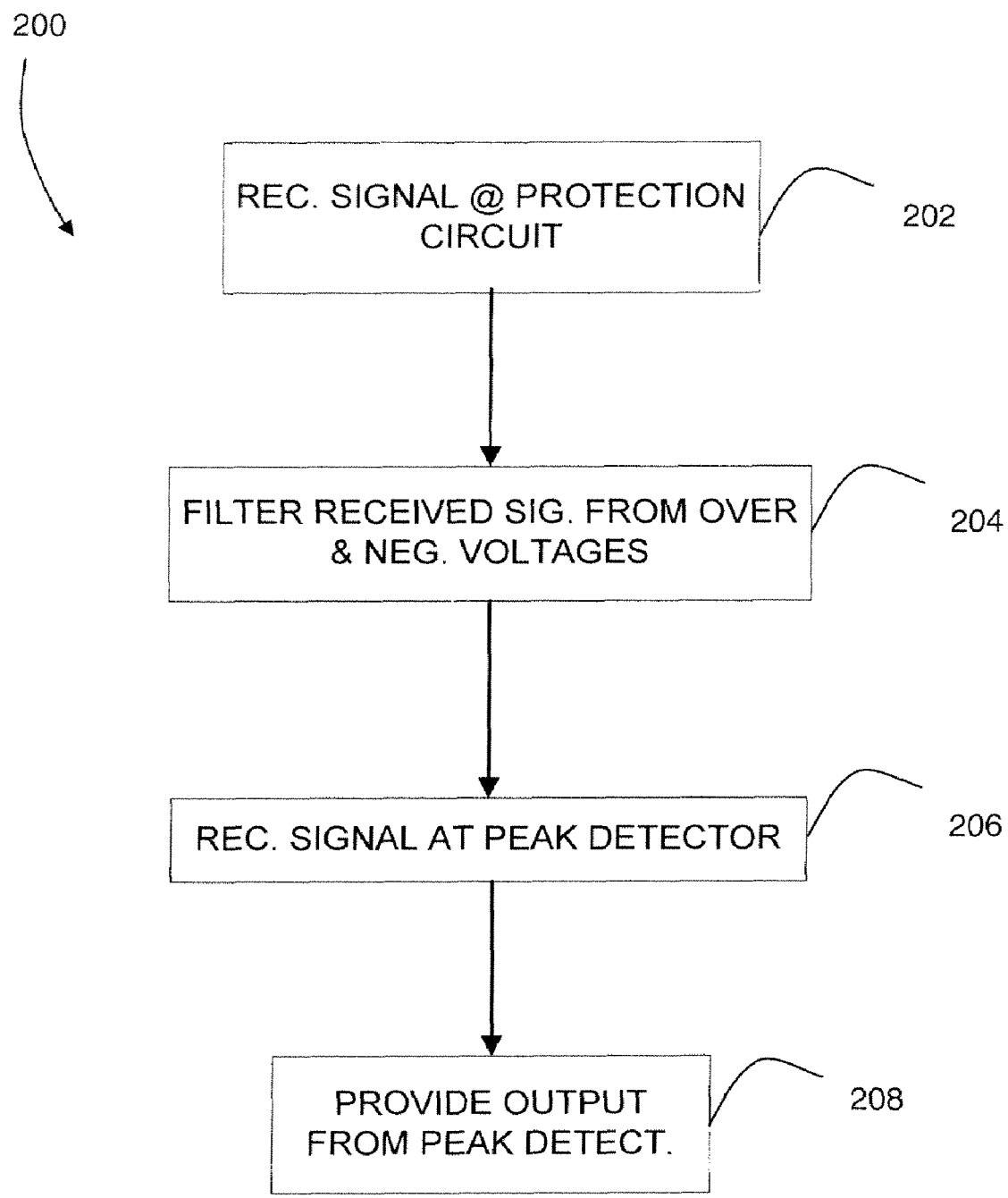
FIG. 2 illustrates a flowchart representative of an exemplary detection and determination process.

FIG. 2 illustrates a flowchart 200 representative of an exemplary detection and determination process. At block 202, a signal representative of a current or voltage change, an alternating current, a positive direct current and/or negative direct current may be received at a protection circuit. At block 204, the protection circuit filters the signal utilizing at least a pair of diodes configured to filter over and/or negative voltages. At block 206, the output is received at a peak detector. At block 208, the peak detector provides and output representative of the signal received at the input stage. Stated another way, the output circuit provides an output based on the comparison of a known reference voltage to the signal output by block 206.

It should be understood that various changes and modifications to the presently preferred embodiments described herein will be apparent to those skilled in the art. Changes and modification may include, but are not limited to, part or component selection, selection of component values or characteristics, precise arrangement and/or layout, inclusion of a single or dual supply. These changes may be implements to affect or alter the performance of the exemplary circuit 100. Such changes and modifications can be made without departing from the spirit and scope of the present invention and without diminishing its intended advantages. It is therefore intended that such changes and modifications be covered by the appended claims.

What is claimed is:

1. A device for current detection, the device comprising:
    a protection circuit comprising:
        a current input provided via a positive input and a negative input arranged in parallel to the positive input;
        a positive input capacitor arranged along the positive input;
        a negative input capacitor arranged along the negative input;
        a pair of diodes communicatively coupling the positive input to the negative input, wherein the pair of diodes are configured to protect an operational amplifier from an overvoltage and negative voltages; and
    a peak detector in communication with the protection circuit, wherein the peak detector is configured to receive an output provided by the operational amplifier, and wherein the peak detector is configured to create a peak detector output representative of the current input.

2. The device of claim 1, wherein the positive input capacitor and the negative input capacitor are configured to protect the operational amplifier from a dc loading condition.

3. The device of claim 1, wherein peak detector comprises a Schmitt trigger.

4. The device of claim 1, wherein peak detector comprises a comparator.

5. The device of claim 1, wherein the pair of diodes includes a first diode arranged in between the positive input and the negative input and the second diode is arranged along the positive input.

6. A device for current detection, the device comprising:
    a protection circuit comprising:
        a current input provided via a positive input, and a negative input arranged in parallel to the positive input;
        a first capacitor arranged along the positive input, and a second capacitor arranged along the negative input; and
        a pair of diodes communicatively coupling the positive input to the negative input, wherein the pair of diodes are configured to protect an operational amplifier from an overvoltage and negative voltages; and
    a Schmitt trigger in communication with the protection circuit, wherein the Schmitt trigger is configured to receive an output provided by the operational amplifier of the protection circuit, and wherein the Schmitt trigger is configured to create an output representative of the current input.

7. The device of claim 6, wherein
    the first capacitor is a positive input capacitor arranged along the positive input; and
    the second capacitor is a negative input capacitor arranged along the negative input;
    wherein the positive and negative input capacitors are configured to protect the operational amplifier from a dc loading condition.

8. The device of claim 6, wherein the Schmitt trigger comprises a comparator.

9. The device of claim 6 wherein the pair of diodes includes a first diode arranged in between the positive input and the negative input and the second diode is arranged along the positive input.

10. A device for current detection, the device comprising:
    a protection circuit comprising:
        a current input provided via a positive input and a negative input arranged in parallel to the positive input;
        a positive input capacitor arranged along the positive input; and
        a negative input capacitor arranged along the negative input;
        a pair of diodes communicatively coupling the positive input to the negative input, wherein a first diode is arranged in between the positive input and the negative input and the second diode is arranged along the positive input, and wherein the pair of diodes is configured to protect an operational amplifier from an overvoltage and negative voltages; and
    a comparator in communication with the protection circuit, wherein the comparator is configured to receive an output provided by the operational amplifier of the protection circuit, and wherein the comparator is configured to create a comparator output representative of the current input.

11. A method of current detection, the method comprising:
    receiving a current input via a positive input and a negative input arranged in parallel to the positive input;
    protecting an operational amplifier from:
        a dc loading condition utilizing first and second capacitors arranged respectively along the positive and negative inputs, and
        an overvoltage and negative voltages utilizing a pair of diodes communicatively coupling the positive input to the negative input, wherein a first diode is arranged in between the positive input and the negative input and the second diode is arranged along the positive input; and
    generating a comparator output representative of the current input, wherein the comparator is configured to receive an output provided by the operational amplifier.

12. A device for current detection, the device comprising:
    a protection circuit comprising:
        a positive input and a negative input arranged in parallel to the positive input, wherein the positive input and the negative input define a current input;
        a pair of diodes communicatively coupling the positive input to the negative input, wherein the pair of diodes includes a first diode arranged in between the positive input and the negative input and the second diode is arranged along the positive input, and wherein the pair of diodes are configured to protect an operational amplifier from an overvoltage and negative voltages; and
    a peak detector in communication with the protection circuit, wherein the peak detector is configured to receive an output provided by the operational amplifier, and wherein the peak detector is configured to create a peak detector output representative of the current input.

* * * * *